United States Patent
Kim et al.

(10) Patent No.: US 8,859,159 B2
(45) Date of Patent: Oct. 14, 2014

(54) APPARATUS AND METHOD FOR GENERATING VIRTUAL SOUND SOURCE FOR MONITORING THE OPERATING STATE OF A FUEL CELL STACK

(71) Applicants: Hyundai Motor Company, Seoul (KR); Kia Motors Corporation, Seoul (KR)

(72) Inventors: Sae Hoon Kim, Gyeonggi-do (KR); Sang Mun Chin, Seoul (KR); Kwi Seong Jeong, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 14/167,312

(22) Filed: Jan. 29, 2014

(65) Prior Publication Data
US 2014/0242486 A1 Aug. 28, 2014

Related U.S. Application Data

(63) Continuation of application No. 12/953,345, filed on Nov. 23, 2010, now Pat. No. 8,669,018.

(30) Foreign Application Priority Data

Sep. 29, 2010 (KR) ........................ 10-2010-0094052

(51) Int. Cl.
*H01M 8/24* (2006.01)
*H01M 8/04* (2006.01)

(52) U.S. Cl.
CPC ............ *H01M 8/24* (2013.01); *H01M 8/04298* (2013.01)
USPC ........................................................ 429/452

(58) Field of Classification Search
None
See application file for complete search history.

(56) References Cited

U.S. PATENT DOCUMENTS

| | | | |
|---|---|---|---|
| 8,305,221 B2 | 11/2012 | Kim et al. | |
| 2009/0080672 A1 | 3/2009 | Smith | |

FOREIGN PATENT DOCUMENTS

| | | |
|---|---|---|
| JP | 11-288-291 A | 10/1999 |
| JP | 2002-233001 A | 8/2002 |
| JP | 2005-031606 A | 2/2005 |
| KR | 10-2004-0103430 | 12/2004 |
| KR | 10-2008-0004967 A | 1/2008 |
| KR | 10-2009-0116320 | 11/2009 |
| KR | 10-2010-0017735 A | 2/2010 |

*Primary Examiner* — Patrick Ryan
*Assistant Examiner* — Christopher Domone
(74) *Attorney, Agent, or Firm* — Edwards Wildman Palmer LLP; Peter F. Corless

(57) ABSTRACT

The present invention provides an apparatus and method for generating a virtual sound source for monitoring the operating state of a fuel cell stack, which monitors in real time the deviation and deterioration of a plurality of cells in a fuel cell stack during operation, and expresses the results as a chord or different sounds, thus allowing a driver to easily recognize the operating state of the fuel cell stack.

2 Claims, 9 Drawing Sheets

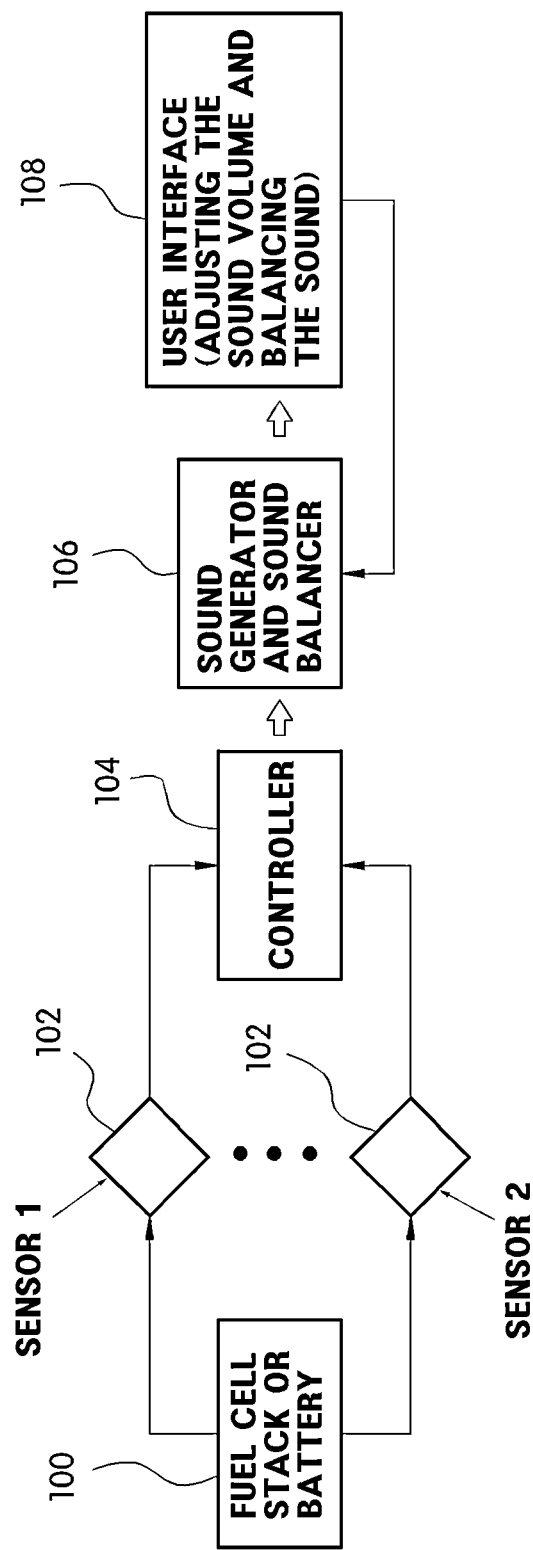

CELL VOLTAGE DISTRIBUTION OF
FUEL CELL STACK AT LOW POWER LEVEL (CURRENT)

CELL VOLTAGE DISTRIBUTION OF FUEL CELL STACK AT HIGH POWER LEVEL (CURRENT)

APPARATUS AND METHOD FOR GENERATING VIRTUAL SOUND SOURCE FOR MONITORING THE OPERATING STATE OF A FUEL CELL STACK

CROSS-REFERENCE TO RELATED APPLICATION

This application is a Continuation of U.S. patent application Ser. No. 12/953,345, filed Nov. 23, 2010, which claims the benefit of Korean Patent Application No. 10-2010-0094052, filed Sep. 29, 2010, under 35 U.S.C. §119(a). The entire contents of the above-referenced applications are incorporated herein by reference.

BACKGROUND (a) Technical Field

The present disclosure relates to an apparatus and method for generating a virtual sound source for monitoring the operating state of a fuel cell stack. More particularly, it relates to an apparatus and method for generating a virtual sound source for monitoring the operating state of a fuel cell stack, which monitors in real time the deviation and deterioration of a plurality of cells in a fuel cell stack during operation, and expresses the results as a chord or different sounds, thus allowing a driver to easily recognize the operating state of the fuel cell stack.

(b) Background Art

A fuel cell vehicle as a zero-emission vehicle and an electric vehicle using a battery provide various advantages including an improvement in fuel efficiency, a reduction in noise, etc., and have attracted much attention as next generation vehicles.

Regardless of these advantages, the fuel cell vehicle and the electric vehicle do not generate noise that can be heard by a driver or pedestrian, and thus a concept of a virtual sound source is introduced.

Korean Patent Publication No. 10-2009-0116320 discloses a sound generating apparatus for a fuel cell vehicle, which generates in real time a sound that a driver wants to hear so as to satisfy the driver's emotional needs and to allow a pedestrian to recognize the sound, thus preventing safety accidents.

Japanese Patent Publication No. 1999-288291 discloses an electric vehicle driven by a motor, which generates a dummy sound according to the operating state of the vehicle, to attract a driver's attention.

While the above-described technologies generate a sound that increases and decreases in proportion to the speed or power of the vehicle to allow the driver and pedestrian to audibly recognize the vehicle, the artificial sound is played repeatedly, which is monotonous. Moreover, as many vehicles generate the same monotonous sound, there is no distinction between vehicles, resulting simply in noise.

While there is an advantage that the simple dummy sound attracts attention of the driver and pedestrian, the same sound generated by many vehicles acts as a noise, and it is difficult for the driver to recognize the operating state of the vehicle.

SUMMARY OF THE DISCLOSURE

The present invention has been made to solve the above-described problems associated with the prior art. Accordingly, the present invention provides an apparatus and method for generating a virtual sound source for monitoring the operating state of a fuel cell stack, which monitors the operating state of a fuel cell stack for a fuel cell vehicle to create a chord or different sounds, which are changed in real time according to the operating state of the fuel cell stack, such that a driver and pedestrian can hear distinct sounds, not noise, and generates a warning sound indicating whether there is an abnormality in the fuel cell stack, thus allowing the driver to easily recognize the operating state of the fuel cell stack.

In one aspect, the present invention provides an apparatus for generating a virtual sound source for monitoring an operating state of a fuel cell stack, the apparatus including: a fuel cell stack comprising a plurality of cells; a sensor unit comprising a plurality of sensors for detecting the operating state of the fuel cell stack; a controller for receiving signals of the sensor unit to select a chord based on the signals of the sensor unit or select a specific sound based on each signal of the sensor unit; a sound generator for receiving a signal of the controller to generate a chord based on the signals of the respective sensors or generate a sound selected by the controller; and a user interface for adjusting the type and volume of the sound generated by the sound generator.

In a preferred embodiment, the sensor unit comprises: a temperature sensor for detecting a temperature of air, hydrogen, and coolant supplied to and discharged from the fuel cell stack; a current sensor for detecting a current signal of the fuel cell stack; a hydrogen sensor for detecting a concentration of hydrogen discharged from the fuel cell stack; a plurality of cell voltage sensors for detecting the cell voltages according to a current when electricity is generated by the cells of the fuel cell stack; and a frequency detector for detecting a response frequency of the fuel cell stack according to a total harmonic distortion method (THD).

In another aspect, the present invention provides a method for generating a virtual sound source for monitoring an operating state of a fuel cell stack, the method comprising: monitoring the operating state of a fuel cell stack; selecting a specific chord or sound according to the operating state of the fuel cell stack and generating the selected chord or sound; and allowing a driver to hear the generated chord or sound and recognize whether the operating state of the fuel cell stack is normal or abnormal.

In a preferred embodiment, in the step of selecting the chord or sound, a virtual sound according to a signal of an output sensor of the fuel cell stack during operation may be generated and, at the same time, a different chord or sound according to a plurality of cell voltages of the fuel cell stack, a current of the fuel cell stack, and a response frequency of the fuel cell stack according to THD may be generated.

In another preferred embodiment, the method may further include adjusting the type and volume of the generated chord or sound.

Other aspects and preferred embodiments of the invention are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention:

FIG. 1 is configuration diagram showing an apparatus for generating a virtual sound source for monitoring the operating state of a fuel cell stack in accordance with a preferred embodiment of the present invention.

FIG. 5A shows current-voltage characteristic curves of a normal cell and an abnormal cell and FIG. 5B shows a current-voltage characteristic curve of a fuel cell stack in which normal cells and abnormal cells are present in a ratio of 5:1.

FIG. 6A shows the response characteristics of a fuel cell stack including only normal cells and FIG. 6B shows the response characteristics of a fuel cell stack in which an abnormal cell is present.

Figure 2A:
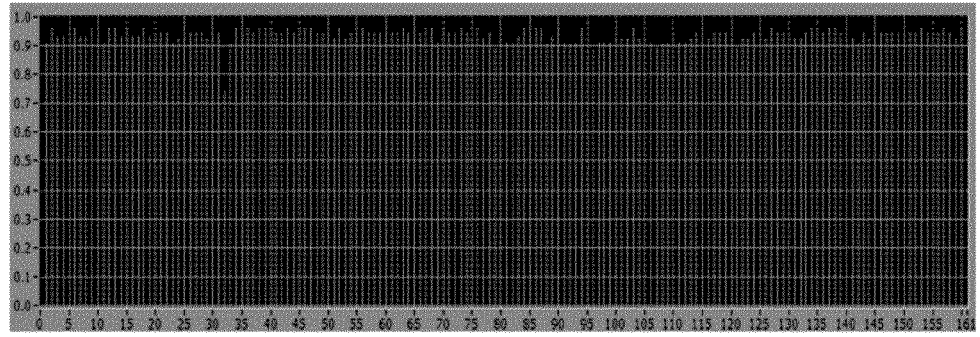
FIGS. 2A, 2B, and 2C are diagrams showing the distribution of voltages measured from a plurality of cells as the operating state of the fuel cell stack.

Reference numerals set forth in the Drawings includes reference to the following elements as further discussed below:

| | |
|---|---|
| 100: fuel cell stack | 102: sensor unit |
| 104: controller | 106: sound generator |
| 108: user interface | |

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

In one aspect, the present invention provides an apparatus and method for generating a virtual sound source for monitoring the operating state of a fuel cell stack, characterized in that different voltage signals are received from a plurality of unit cells that constitute a fuel cell stack during operation and expressed as a chord by a sound generating means, such that the operation sound expressed as a chord is heard by a driver and pedestrian.

In another aspect, the present invention is characterized in that different sounds are reproduced according to the operating state of a fuel cell vehicle equipped with the fuel cell stack to be heard by the driver and pedestrian so as to attract their attention, thereby improving the safety. Additionally, different sounds according to the operating state of the fuel cell stack are reproduced to allow the driver to easily recognize the current state of the fuel cell stack.

Figure 7:
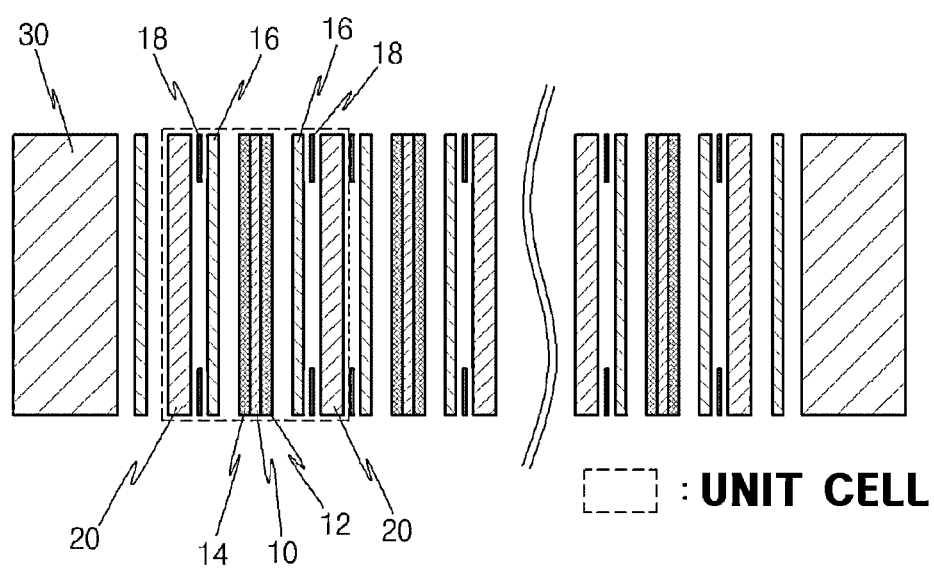
FIG. 7 is a schematic diagram showing the configuration of a fuel cell stack.

For a better understanding of the present invention, the configuration of the fuel cell stack will be described briefly with reference to FIG. 7 below.

A membrane electrode assembly (MEA) is located in the middle of the fuel cell stack and includes a polymer electrolyte membrane 10, through which hydrogen ions (protons) are transported, and an electrode/catalyst layer such as an air electrode (cathode) 12 and a fuel electrode (anode) 14, in which an electrochemical reaction between hydrogen and oxygen takes place, which are disposed on each of both sides of the polymer electrolyte membrane 10.

A gas diffusion layer (GDL) 16 and a gasket 18 are sequentially stacked on both sides of the MEA, where the cathode 12 and the anode 14 are located. A separator 20 including flow fields for supplying fuel and discharging water generated by the reaction is located on the outside of the GDL 16, and an end plate 30 for supporting and fixing the above-described components is connected to each of both ends thereof.

At the anode 14 of the fuel cell stack, hydrogen is dissociated into hydrogen ions (protons, $H^+$) and electrons ($e^-$) by an oxidation reaction of hydrogen. The hydrogen ions and electrons are transmitted to the cathode 12 through the electrolyte membrane 10 and the separator 20, respectively. At the cathode 12, water is produced by an electrochemical reaction in which the hydrogen ions and electrons transmitted from the anode 14 and the oxygen in air participate and, at the same time, electrical energy is produced by the flow of electrons.

A variety of sensors for detecting the operating state of the fuel cell stack are mounted in the fuel cell stack.

One sensor includes a temperature sensor for detecting the temperature of air, hydrogen, and coolant supplied to and discharged from the fuel cell stack, which is mounted in each of the inlet and outlet. Moreover, an current sensor for detecting an current signal, a hydrogen sensor for detecting the concentration of hydrogen discharged from the fuel cell stack, a plurality of cell voltage sensors for detecting the cell voltages when electricity is generated by the cells of the fuel cell stack, etc. are mounted in predetermined positions of the fuel cell stack.

In certain embodiments, a frequency detector for detecting a frequency response signal according to a THD method is further provided.

In another embodiment, the apparatus and method according to the present invention monitors signals of a sensor unit to indicate the operating state of the fuel cell stack and generates an audible sound according to the operating state. In various embodiments, the apparatus and method according to the present invention generates a complex sound like a chord based on the signals of the sensor unit to allow the driver to audibly recognize the current state of the fuel cell stack.

For this purpose, the apparatus for generating the virtual sound source of the present invention includes a controller 104 for receiving a signal of a sensor unit 102 and selecting a sound, a sound generator 106 for receiving a signal of the controller 104 and generating a chord or reproducing the selected sound, and a user interface 108 for adjusting the type and volume of the sound generated by the sound generator 106.

In certain embodiments, the method for generating the virtual sound source of the present invention having the above configuration will be described as follows.

First, the sensor unit 102 monitors the operating state of the fuel cell stack during operation.

The temperature of air, hydrogen, and coolant supplied to and discharged from a fuel cell stack 100 is detected by the temperature sensor, the output of electricity generated by the fuel cell stack 100 is detected by the output sensor (e.g., the output is calculated by measuring the total current and voltage of the fuel cell stack), the concentration of hydrogen discharged from the fuel cell stack 100 as a factor that determines the safety of the fuel cell stack 100 is detected by the hydrogen sensor, and the voltage according to the current is detected by the voltage sensor when electricity is generated by the cells of the fuel cell stack 100.

Moreover, a specific frequency according to the abnormal frequency response method generated by the fuel cell stack 100 is detected by the frequency detector, and various factors that affect the operating state of the fuel cell stack 100 can be measured or detected.

Figure 2B:
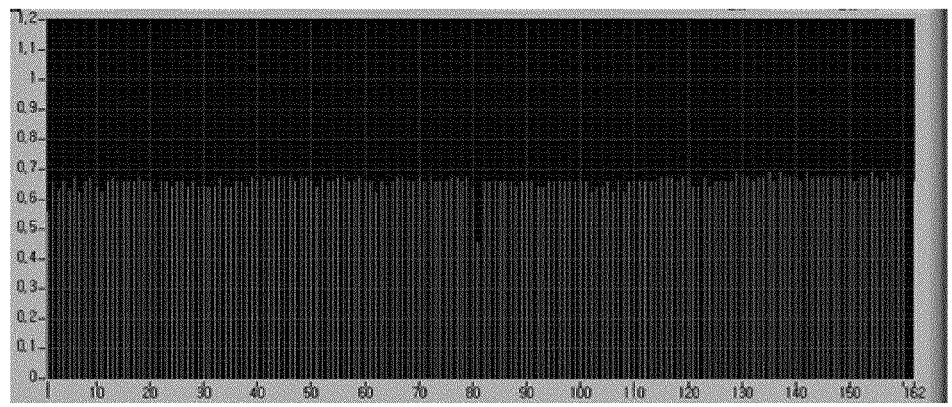
Figure 2C:
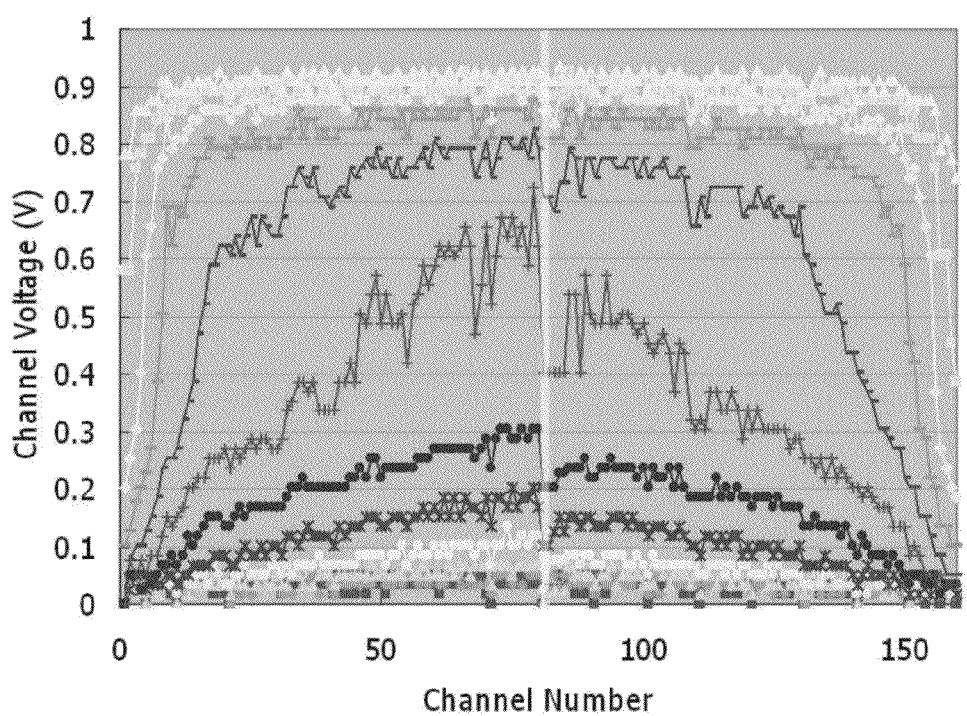

As shown in FIG. 2C, the plurality of cells of the fuel cell stack 100 have specific voltage distribution curves according to the design of the fuel cell stack during start-up, during operation, and during shut-down. That is, the plurality of cells output different voltages, and the voltages output by the plurality of unit cells are measured by the voltage sensors.

The controller 104 receiving the signal of the sensor unit 102 selects a chord or sound according to the corresponding signal of the sensor unit 102.

Since each sensor of the sensor unit 102 provides a different signal to the controller 104 according to the operating state of the fuel cell stack 100, the controller 104 selects a different chord or sound according to the signal of each sensor.

In preferred embodiments, when receiving voltage signals of the plurality of unit cells that constitute the fuel cell stack 100 from the voltage sensors, the controller 104 transmits a signal for expressing the voltages of the respective unit cells as a chord to the sound generator 106 such that the operation sound of the fuel cell stack 100 is heard as a chord by the driver and pedestrian.

Subsequently, the sound generator 106 receiving the signal of the controller 104 generates the selected sound.

Provided below are examples of the present invention, in which various different sounds according to the signals of the respective sensors are generated, will be described, and the present invention is not limited by the following examples.

Example 1

Sound Generation According to Cell Voltages

During operation of the fuel cell stack, the voltages of the respective cells of the fuel cell stack or an average output voltage of several cells are measured by the voltage sensor. FIG. 2A shows the cell voltage distribution at a low power level, FIG. 2B shows the cell voltage distribution at a high power level, and FIG. 2C shows the cell voltage distribution (measured at intervals of 0.1 seconds) during initial start-up.

The plurality of unit cells of the fuel cell stack show specific voltage distribution curves during start-up, during operation, and during shut-down and output different voltages. Accordingly, the voltages generated by the plurality of unit cells are measured by the voltage sensors. In this case, the cell voltages may be measured from all of the unit cells or an average value obtained by measuring the voltages of several cells may be used.

When receiving the voltage signals of the plurality of unit cells of the fuel cell stack from the voltage sensors, the controller 104 transmits the signals for expressing the voltages of the respective cells as a chord to the sound generator 106.

Then, the sound generator 106 expresses the operation sound of the fuel cell stack in response to the signals of the controller 104, i.e., a first chord of the output voltage sounds of the respective cells such that the operation sound of the fuel cell stack is heard as a chord by the driver and pedestrian.

Here, sounds of different tones or pitches according to the voltages of the respective cells are generated, and a different sound is generated from an abnormal cell such that the driver can audibly recognize that there is an abnormality in the cell voltage of the fuel cell stack.

If performance deterioration, in which the voltage of a specific cell rapidly drops, which occurs among the plurality of cells, the chord generated by the sound generator is heard as a discord such that the driver can audibly recognize that there is an abnormality in the output voltage of a specific cell among the plurality of cells of the fuel cell stack.

As such, the sounds generated according to the cell voltages are expressed as a chord. Alternatively, various different sounds can be selectively generated according to various factors for operating the fuel cell stack such as the temperature of the fuel cell stack, the output of the fuel cell stack, and the current-voltage sensors (e.g., the frequency response characteristics of the fuel cell stack according to the abnormal frequency response method), which will be described below.

Example 2

Sound Generation According to the Temperature of the Fuel Cell Stack

Figure 3:
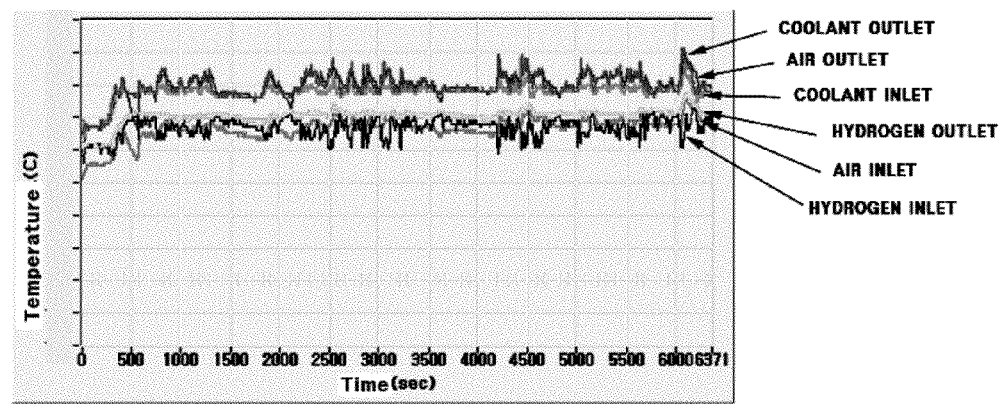
FIG. 3 is a diagram showing the signals measured detected by a temperature sensor for detecting the temperature of air, hydrogen, and coolant as the operating state of the fuel cell.

During operation of the fuel cell stack, the temperatures of air, hydrogen, and coolant supplied to and discharged from the fuel cell stack are detected as a factor that determines the performance of the fuel cell stack. FIG. 3 shows an example of the signals detected by the temperature sensor of the fuel cell stack.

Accordingly, the controller receives a signal of the temperature sensor during operation of the fuel cell stack and, if the measurement value of the temperature sensor exceeds a normal range, selects a second chord. Then, the sound generator generates the second chord indicating that the temperature is abnormal such that the driver audibly recognizes that there is an abnormality in the temperature of the fuel cell stack.

Example 3

Sound Generation According to the Output Power of the Fuel Cell Stack

Figure 4:
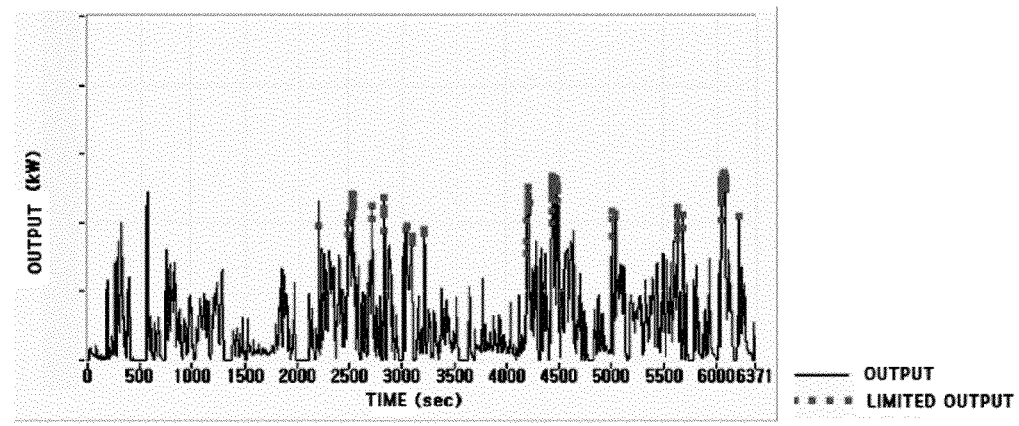
FIG. 4 is a diagram showing the output power state of the fuel cell stack as the operating state of the fuel cell.

As shown in the output waveforms of FIG. 4, various outputs are generated according to the driving style of the driver or the driving modes during operation of the fuel cell stack, and the output power is limited if necessary. Sounds of different strengths, pitches, and tones are generated according to the power outputs of the fuel cell stack. Accordingly, the controller receives an output signal of the fuel cell stack and, if it is determined that the output power of the fuel cell stack is limited due to an abnormal factor of the fuel cell stack or system, selects a third chord. Then, the sound generator generates the third chord indicating that the output of the fuel cell stack is abnormal such that the driver audibly recognizes that there is an abnormality in the output of the fuel cell stack.

Example 4

Figure 5A:
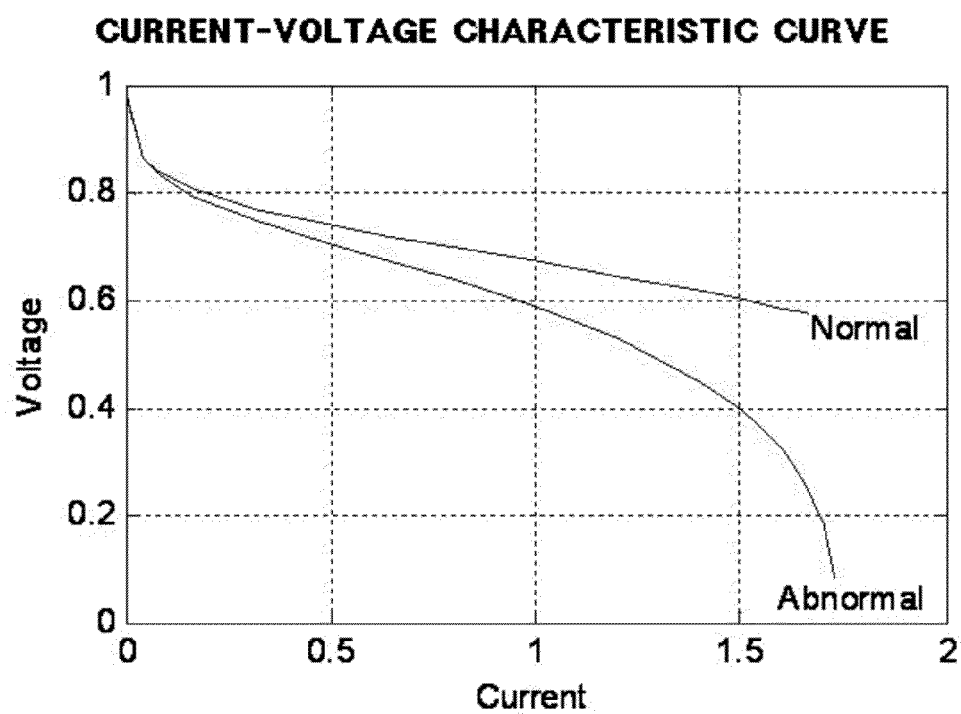
FIGS. 5A and 5B are graphs showing current-voltage characteristic curves as the operating state of the fuel cell.
Figure 5B:
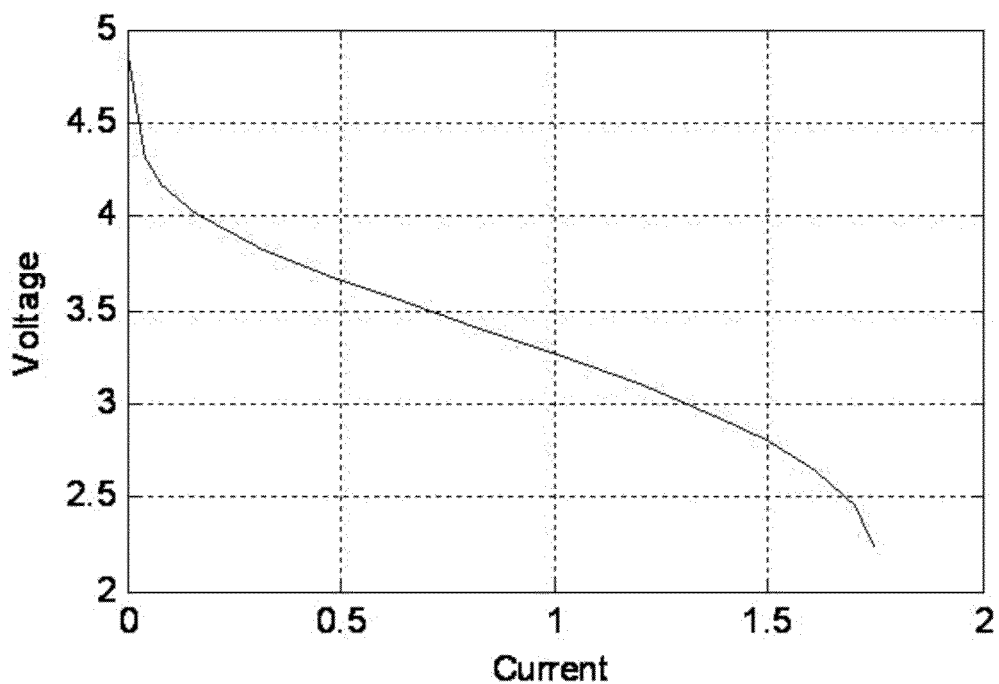

Sound Generation According to the Response Frequency of the Fuel Cell Stack by the THD Method As shown in FIG. 5A, each cell of the fuel cell stack 100 has an intrinsic current-voltage characteristic curve, and an abnormal cell may be present along with normal cells. FIG. 5B shows the total voltage according to the current of the fuel cell stack in which five normal cells and one abnormal cell are present together.

Figure 6A:
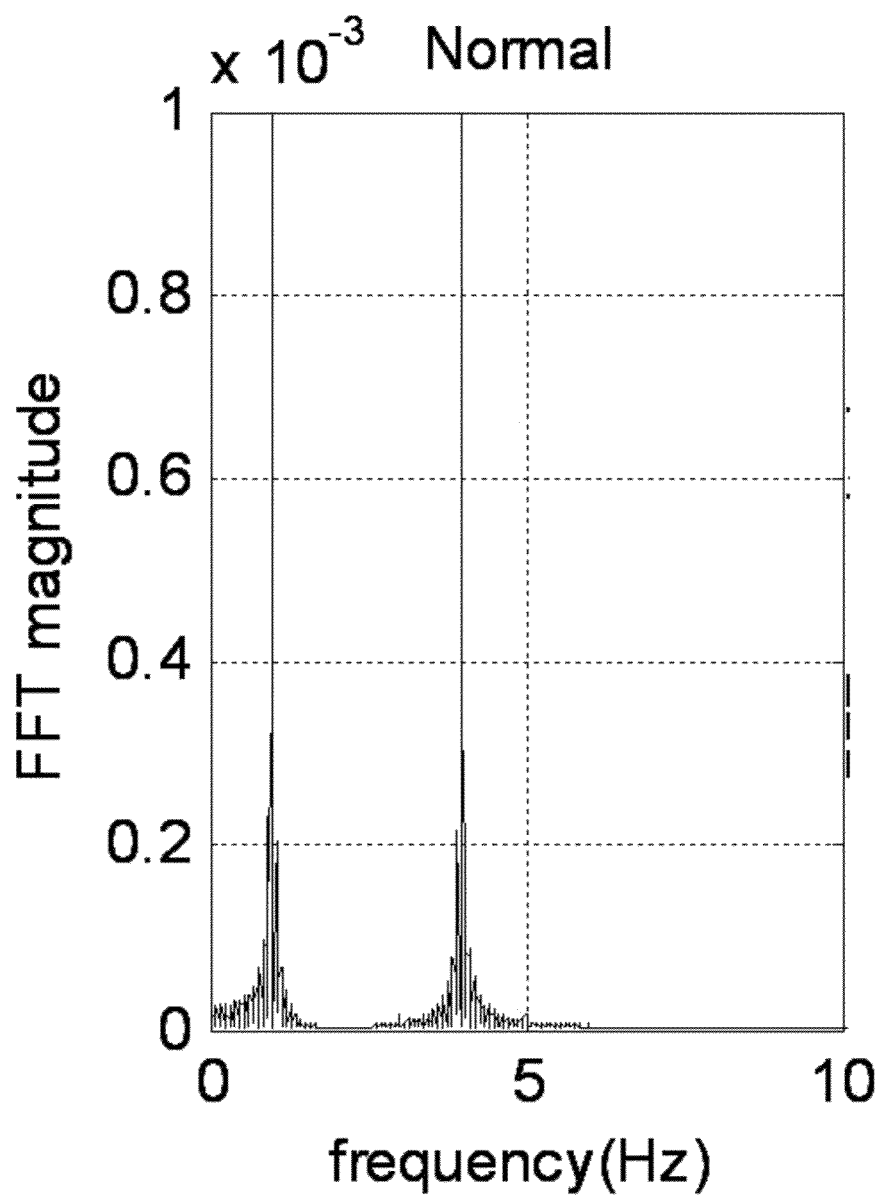
FIGS. 6A and 6B are graphs showing examples of the operating state of the fuel cell stack analyzed by a THD method.

The frequency response method can detect the abnormal cell without measuring the voltages of the respective cells using the voltage sensor. FIG. 6A shows a frequency response curve as a frequency response signal of a fuel cell stack including only normal cells, and FIG. 6B shows a frequency response curve as a frequency response signal of a fuel cell stack in which an abnormal cell is present.

Figure 6B:
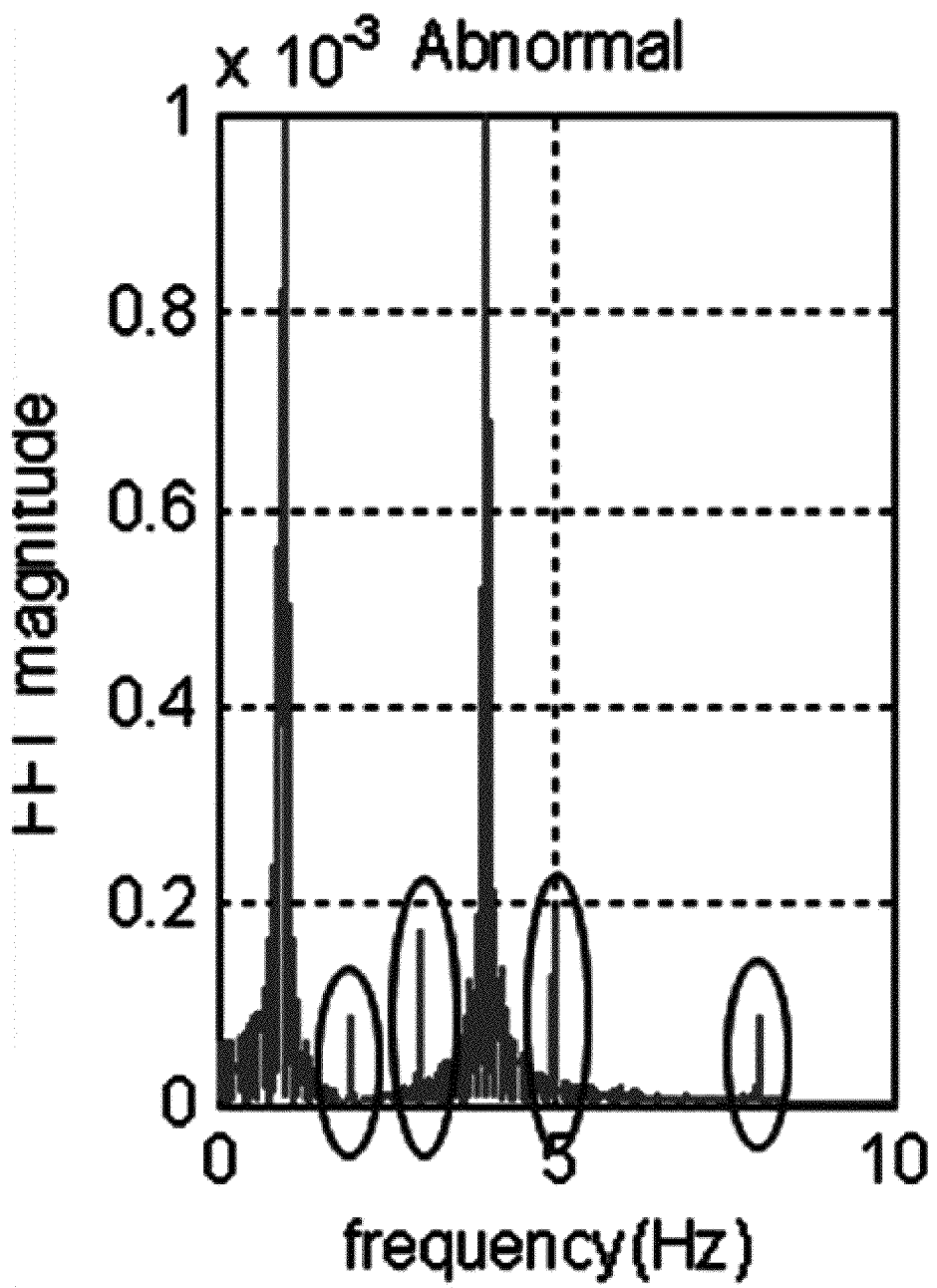

As shown in FIG. 6B, in the case where an abnormal cell is present in the fuel cell stack, a frequency different from an input frequency is detected by the frequency detector. When receiving a detection signal from the frequency detector, the controller determines that the frequency is abnormal and selects a fourth chord. Then, the sound generator generates the fourth chord indicating that an abnormal cell is included in the fuel cell stack such that the driver audibly recognizes that an abnormal cell is included in the fuel cell stack.

Meanwhile, a user interface connected to the sound generator to transmit and receive an electric signal to and from the sound generator may be used to change the type of the sound generated by the sound generator or to adjust the volume of the sound.

As such, the apparatus and method for generating the virtual sound source for monitoring the operating state of the fuel cell stack according to the present invention is applicable to the hybrid vehicle or the electric vehicle, which uses a battery, composed of a plurality of cells, as well as the fuel cell vehicle using the fuel cell stack.

That is, in the case of the battery equipped in the electric vehicle or the hybrid vehicle, the above-described virtual sound source can be easily produced using the voltages of the respective cells, the output of the battery, the temperature of the battery, and the state of charge (SCO) of the battery, measured by a battery management system (BMS).

As described above, the present invention provides the following effects:

(1) In the vehicle that does not generate noise such as a fuel cell vehicle, an electric vehicle, a hybrid vehicle, etc., the functions like the piano keys are provided to the voltage signals of several tens to several hundreds of cells of the fuel cell stack or battery or to an average voltage signal of several cells such that the voltage signals or the average voltage signal are expressed as a virtual sound like a chord, thus allowing the driver or pedestrian to easily recognize the operating state of the fuel cell stack;

(2) As the virtual sound is generated during running of the vehicle, it is possible to provide an audible signal to the driver and pedestrian, thereby ensuring safety; and (3) Especially, as the driver can recognize the operating state of the fuel cell stack mounted in the vehicle by the audible signal, the driver can easily determine the normal and abnormal operating states of the fuel cell stack.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. An apparatus for generating a virtual sound source for monitoring an operating state of a fuel cell stack, the apparatus comprising:
a fuel cell stack comprising a plurality of cells;
a sensor unit comprising a plurality of sensors configured to detect the operating state of the fuel cell stack;
a controller configured to receive signals of the sensor unit to select a chord based on the signals of the sensor unit or select a specific sound based on each signal of the sensor unit;
a sound generator configured to receive a signal of the controller to generate a chord based on the signals of the respective sensors or generate a sound selected by the controller; and
a user interface configured to adjust the type and volume of the sound generated by the sound generator.

2. The apparatus of claim 1, wherein the sensor unit comprises:
a temperature sensor configured to detect a temperature of air, hydrogen, and coolant supplied to and discharged from the fuel cell stack;
an output sensor configured to detect an output signal of the fuel cell stack;
a hydrogen sensor configured to detect a concentration of hydrogen discharged from the fuel cell stack;
a voltage sensor configured to detect a voltage according to a current when electricity is generated by the cells of the fuel cell stack; and
a frequency detector configured to detect a response frequency of the fuel cell stack according to an abnormal frequency response method.

* * * * *